United States Patent
Shiota et al.

(10) Patent No.: US 6,406,794 B1
(45) Date of Patent: Jun. 18, 2002

(54) FILM-FORMING COMPOSITION

(75) Inventors: Atsushi Shiota, Ibaraki (JP); Takahiko Kurosawa, Goleta, CA (US); Eiji Hayashi; Makoto Sugiura, both of Ibaraki (JP); Toshiyuki Akiike; Keiji Konno, both of Mie (JP); Tadahiro Shiba, Tochigi (JP); Kohei Goto; Kinji Yamada, both of Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/778,822

(22) Filed: Feb. 8, 2001

(51) Int. Cl.$^7$ ................................................. B32B 9/04
(52) U.S. Cl. ........................... 428/447; 528/34; 524/837
(58) Field of Search ........................... 428/447; 528/34; 524/837

(56) References Cited

U.S. PATENT DOCUMENTS

| | | | |
|---|---|---|---|
| 5,622,684 A | 4/1997 | Pinnavaia et al. | |
| 5,795,559 A | 8/1998 | Pinnavaia et al. | |
| 5,858,457 A | 1/1999 | Brinker et al. | |
| 5,922,299 A | 7/1999 | Bruinsma et al. | |
| 6,248,686 B1 * | 6/2001 | Inagaki et al. | 502/158 |

* cited by examiner

Primary Examiner—Robert Dawson
Assistant Examiner—Christopher M. Keehan
(74) Attorney, Agent, or Firm—Oblon, Spivak, McClelland, Maier & Neustadt, P.C.

(57) ABSTRACT

A film-forming composition comprising: (A) at least one silane compound selected from the group consisting of a compound shown by the following formula (1), a compound shown by the following formula (2), and a compound shown by the following formula (3) and a hydrolysis condensate of these compounds:

$$R^2R^3Si(OR^1)_2 \quad (1)$$

$$R^2Si(OR^1)_3 \quad (2)$$

$$Si(OR^1)_4 \quad (3)$$

wherein $R^1$, $R^2$, and $R^3$ individually represent a monovalent organic group, (B) a polyether shown by the formula $(PEO)_p$—$(PPO)_q$—$(PEO)_r$, wherein PEO represents a polyethylene oxide unit, PPO represents a polypropylene oxide unit, p is a number of 2–200, q is a number of 20–80, and r is a number of 2–200, and (C) an organic solvent. The composition exhibits superior storage stability, is capable of producing a low-density film having a small relative dielectric constant, low water absorption properties, and small vacant space size, and is thus suitable as an interlayer dielectric material in the manufacture of semiconductor devices.

17 Claims, No Drawings

FILM-FORMING COMPOSITION

BACKGROUND OF THE INVENTION

1. Field of the Invention

The present invention relates to a film-forming composition and, more particularly, to a film-forming composition suitable as an interlayer dielectric material in the manufacture of semiconductor devices, exhibiting excellent relative dielectric constant characteristics and moisture-absorption characteristics, capable of forming coatings with a small vacant space size, and exhibiting superior storage stability.

2. Description of the Background Art

Conventionally, silica ($SiO_2$) films formed by a vacuum process such as a CVD process have been extensively used as an interlayer dielectric in the manufacture of semiconductor devices and the like. In recent years, an SOG (spin on glass) film which is a coating-type insulating film made from a composition containing tetraalkoxysilane hydrolyzate as a major component is used with the objective of forming a homogeneous interlayer dielectric. As high integration of semiconductor devices has advanced, an interlayer dielectric with a low relative dielectric constant made from a composition containing polyorganosiloxane as a major component, which is called an organic SOG, has been developed.

However, demand for further integration and layer multiplication of semiconductor devices requires more excellent electric insulation among conductors. Development of a more excellent interlayer dielectric material having a lower relative dielectric constant and exhibiting superior crack resistance is thus strongly desired.

WO 99/03926 discloses a composition for manufacturing an insulating layer for a multi-layer interconnect structure for semiconductor devices with a low relative dielectric constant. This Patent Application discloses a composition comprising a silica component and a thermally decomposable polymer which are dissolved in a specific solvent.

It is, however, difficult for the composition disclosed in WO 99/03926 to maintain adequate mutual affinity among the solvent, thermally decomposable polymer, and silica component, to maintain the micro-layer separation structure after vaporization of the solvent, and to produce a product with homogeneous small vacant spaces after heat treatment. If the mutual affinity between the thermally decomposable polymer and silica component is inadequate, it is difficult to obtain films with a smooth surface by rotation application.

The present invention has been achieved in view of the above situation and has an object of providing a film-forming composition suitable as an interlayer dielectric material in the manufacture of semiconductor devices, which exhibits superior storage stability and can form coatings with an appropriate homogeneous thickness, exhibiting excellent relative dielectric constant characteristics and moisture-absorption characteristics, and having a small vacant space size.

SUMMARY OF THE INVENTION

Specifically, the present invention provides a film-forming composition comprising:

(A) at least one silane compound selected from the group consisting of a compound shown by the following formula (1), a compound shown by the following formula (2), and a compound shown by the following formula (3) and a hydrolysis condensate of these compounds:

$$R^2R^3Si(OR^1)_2 \quad (1)$$

$$R^2Si(OR^1)_3 \quad (2)$$

$$Si(OR^1)_4 \quad (3)$$

wherein $R^1$, $R^2$, and $R^3$ individually represent a monovalent organic group, (B) a polyether shown by the formula $(PEO)_p$—$(PPO)_q$—$(PEO)_r$, wherein PEO represents a polyethylene oxide unit, PPO represents a polypropylene oxide unit, p is a number of 2–200, q is a number of 20–80, and r is a number of 2–200, and (C) an organic solvent.

The component (A) in the above film-forming composition preferably comprises a hydrolysis condensate of one or more silane compounds selected from the group consisting of a compound of the above formula (1), a compound of the above formula (2), and a compound of the above formula (3).

In the above film-forming composition, the hydrolysis condensate is preferably prepared by a hydrolysis condensation reaction of the above silane compounds in the presence of water and a catalyst.

The above catalyst for the hydrolysis condensation reaction is preferably selected from the group consisting of a metal chelating compound, an organic acid, an inorganic acid, an organic base, and an inorganic base.

The above hydrolysis condensation reaction is preferably carried out further in the presence of an organic solvent (C).

The above hydrolysis condensate is preferably a hydrolysis condensate of silane compounds which comprise a compound of the formula (2).

The above hydrolysis condensate is a hydrolysis condensate of silane compounds which comprise a compound of the formula (2) and a compound of the formula (3).

In the above hydrolysis condensate, the amount of the compound of the formula (3), in terms by weight of complete hydrolysis condensate, is preferably 5 to 40 wt % of the total amount of the compound of the formula (1), the compound of the formula (2), and the compound of the formula (3).

In the above hydrolysis condensate, the amount by weight of the compound of the formula (2) is greater than the amount of the compound of the formula (3).

In the above film-forming composition, the polystyrene-reduced weight average molecular weight of the component (A) is preferably 500–300,000.

In the above film-forming composition, the polystyrene-reduced weight average molecular weight of the component (B) is preferably 1,000–20,000.

The film-forming composition of the present invention preferably comprises 1–80 parts by weight of the component (B) for 100 parts by weight of the component (A) as an complete hydrolysis-condensate.

In the above film-forming composition of the present invention, the solvent (C) is an alcohol solvent or a ketone solvent, or both.

The present invention further provides a method of forming a film comprising applying any film-forming composition described above onto a substrate to produce a coated film and heating the coated film.

The present invention further provides a method of forming a film comprising applying any film-forming composition described above onto a substrate to produce a coated film, heating the coated film at a temperature less than the decomposition temperature of the component (B) to partly cure the component (A), and heating the coated film at a temperature above the decomposition temperature of the component (B).

The present invention further provides a method of forming a film comprising applying any film-forming composition described above onto a substrate to produce a coated film and heating the coated film at a temperature above the decomposition temperature of the component (B).

The present invention still further provides a low-density cured film prepared by any one of the above methods.

Other objects, features and advantages of the invention will hereinafter become more readily apparent from the following description.

DETAILED DESCRIPTION OF THE INVENTION AND PREFERRED EMBODIMENTS

In the present invention, the component (A) which comprises components selected from the above compounds (1), (2), and (3) and the hydrolysis condensates of these compounds is used as a base polymer for forming the film, a specific type of block copolymerization polyether (B) is used as a porous material, and the solvent (C) is used for dissolving the components (A) and (B). The composition of the present invention which comprises the components (A) to (C) has excellent storage stability. When this composition is applied to a substrate such as a silicon wafer or the like and heated to remove the solvent (C) and effect thermal polycondensation of the component (A), a glass-like substance or macromolecule polymer of the component (A) is produced and, at the same time, polyether is decomposed and removed, resulting in a low-density film. The film thus obtained is a low-density film having a small relative dielectric constant, excelling in stable electrical characteristics due to its low water absorption properties, and useful as an interlayer dielectric material.

In the present invention, the hydrolyzate of the component (A) does not necessarily mean a compound in which all of the $R^1O$— groups contained in the compounds (1)–(3) are hydrolyzed, but may include compounds with one of the groups hydrolyzed, compounds with two or more of the groups hydrolyzed, and a mixture of these compounds. In the same manner, the condensate in the present invention, which means a condensation product in which the silanol groups in the hydrolyzates of the compounds (1)–(3) are bonded to form Si—O—Si bonds, does not necessarily mean a compound in which all silanol groups are condensed, but includes compounds in which only a small amount of silanol groups are condensed, as well as a mixture of compounds with a different degree of condensation.

The components (A) to (C) and the method of preparing the composition of the present invention will now be described.

Component (A)

As a monovalent organic group in the above compounds (1) to (3), an alkyl group, aryl group, allyl group, glycidyl group, and the like can be given.

The alkyl groups having 1–5 carbon atoms such as a methyl group, ethyl group, propyl group, butyl group, and the like are preferably used. These alkyl groups may be either linear or branched, and the hydrogen atoms on the alkyl groups may be replaced with fluorine atoms.

As aryl groups in the compounds (1)–(3), a phenyl group, naphthyl group, methylphenyl group, ethylphenyl group, chlorophenyl group, bromophenyl group, fluorophenyl group, and the like can be given.

The following compounds can be given as specific examples of the compound shown by the formula (1): dimethyldimethoxysilane, dimethyldiethoxysilane, dimethyl-di-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-di-tert-butoxysilane, diethyl-di-phenoxysilane, di-n-propyldimethoxysilane, di-n-propyldiethoxysilane, di-n-propyl-di-n-propoxysilane, di-n-propyl-di-iso-propoxysilane, di-n-propyl-di-n-butoxysilane, di-n-propyl-di-sec-butoxysilane, di-n-propyl-di-tert-butoxysilane, di-n-propyl-di-phenoxysilane, di-iso-propyldimethoxysilane, di-iso-propyldiethoxysilane, di-iso-propyl-di-n-propoxysilane, di-iso-propyl-di-iso-propoxysilane, di-iso-propyl-di-n-butoxysilane, di-iso-propyl-di-sec-butoxysilane, di-iso-propyl-di-tert-butoxysilane, di-iso-propyl-di-phenoxysilane, di-n-butyldimethoxysilane, di-n-butyldiethoxysilane, di-n-butyl-di-n-propoxysilane, di-n-butyl-di-iso-propoxysilane, di-n-butyl-di-n-butoxysilane, di-n-butyl-di-sec-butoxysilane, di-n-butyl-di-tert-butoxysilane, di-n-butyl-di-phenoxysilane, di-sec-butyldimethoxysilane, di-sec-butyldiethoxysilane, di-sec-butyl-di-n-propoxysilane, di-sec-butyl-di-iso-propoxysilane, di-sec-butyl-di-n-butoxysilane, di-sec-butyl-di-sec-butoxysilane, di-sec-butyl-di-tert-butoxysilane, di-sec-butyl-di-phenoxysilane, di-tert-butyldimethoxysilane, di-tert-butyldiethoxysilane, di-tert-butyl-di-n-propoxysilane, di-tert-butyl-di-iso-propoxysilane, di-tert-butyl-di-n-butoxysilane, di-tert-butyl-di-sec-butoxysilane, di-tert-butyl-di-tert-butoxysilane, di-tert-butyl-di-phenoxysilane, diphenyldimethoxysilane, diphenyl-di-ethoxysilane, diphenyl-di-n-propoxysilane, diphenyl-di-iso-propoxysilane, diphenyl-di-n-butoxysilane, diphenyl-di-sec-butoxysilane, diphenyl-di-tert-butoxysilane, diphenyldiphenoxysilane, and the like.

The following compounds can be given as specific examples of the compound shown by the formula (2): methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltrimethoxysilane, i-propyltri-n-propoxysilane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyl-i-triethoxysilane, sec-butyl-tri-n-propoxysilane, sec-butyl-tri-iso-propoxysilane, sec-butyl-tri-n-butoxysilane, sec-butyl-tri-sec-butoxysilane, sec-butyl-tri-tert-butoxysilane, sec-butyl-triphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tertbutoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane, and the like.

Specific examples of the compound of the formula (3) include tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like.

Of the above compounds, preferable compounds are tetramethoxysilane, tetraethoxysilane, tetra-n-propoxysilane, tetra-iso-propoxysilane, methyltrimethoxysilane, methyltriethoxysilane, methyltri-n-propoxysilane, methyltri-iso-propoxysilane, phenyltrimethoxysilane, phenyltriethoxysilane, dimethyldimethoxysilane, dimethyldiethoxysilane, diphenyldimethoxysilane, and diphenyldiethoxysilane, with particularly preferable compounds being tetramethoxysilane, tetraethoxysilane, methyltrimethoxysilane, methyltriethoxysilane, dimethyldimethoxysilane, and dimethyldiethoxysilane.

These compounds (1)–(3) can be used either individually or in combination of two or more.

In the hydrolysis condensation of the compounds (1)–(3) which form the components (A) in the present invention, water is added in the amount of preferable 0.25 to 3 mols, and more preferable 0.3 to 2.5 mols per one mole of the group represented by $R^1O$—. The addition of water in the amount of 0.25 to 3 mols prevents a decrease in homogeneity of the coating and deposition or gelling of polymers during the hydrolysis condensation reaction.

A catalyst may be used in the hydrolysis condensation reaction of the compounds (1)–(3) which forms the components (A) Metal chelating compounds, organic acids, inorganic acids, organic bases, inorganic bases, and the like can be used as the catalyst in the present invention.

The following compounds are given as examples of the metal chelating compounds: titanium chelate compounds such as triethoxy.mono(acetylacetonate)titanium,
tri-n-propoxy.mono(acetylacetonate)titanium,
tri-i-propoxy.mono(acetylacetonate)titanium,
tri-n-butoxy.mono (acetylacetonate) titanium,
tri-sec-butoxy.mono(acetylacetonate)titanium,
tri-t-butoxy.mono(acetylacetonate)titanium,
diethoxy.bis(acetylacetonate)titanium,
di-n-propoxy.bis(acetylacetonate)titanium,
di-i-propoxy.bis(acetylacetonate)titanium,
di-n-butoxy.bis(acetylacetonate)titanium,
di-sec-butoxy.bis(acetylacetonate)titanium,
di-t-butoxy.bis(acetylacetonate)titanium,
monoethoxy.tris(acetylacetonate)titanium,
mono-n-propoxy.tris(acetylacetonate)titanium,
mono-i-propoxy.tris(acetylacetonate)titanium,
mono-n-butoxy.tris(acetylacetonate)titanium,
mono-sec-butoxy.tris(acetylacetonate)titanium,
mono-t-butoxy.tris(acetylacetonate)titanium,
tetrakis(acetylacetonate)titanium,
triethoxy.mono(ethylacetoacetate)titanium,
tri-n-propoxy.mono(ethylacetoacetate)titanium,
tri-i-propoxy.mono(ethylacetoacetate)titanium,
tri-n-butoxy.mono(ethylacetoacetate)titanium,
tri-sec-butoxy.mono(ethylacetoacetate)titanium,
tri-t-butoxy.mono(ethylacetoacetate)titanium,
diethoxy.bis(ethylacetoacetate)titanium,
di-n-propoxy.bis(ethylacetoacetate)titanium,
di-i-propoxy.bis(ethylacetoacetate)titanium,
di-n-butoxy.bis(ethylacetoacetate)titanium,
di-sec-butoxy.bis(ethylacetoacetate)titanium,
di-t-butoxy.bis(ethylacetoacetate)titanium,
monoethoxy.tris(ethylacetoacetate)titanium,
mono-n-propoxy.tris(ethylacetoacetate)titanium,
mono-i-propoxy.tris(ethylacetoacetate)titanium,
mono-n-butoxy.tris(ethylacetoacetate)titanium,
mono-sec-butoxy.tris(ethylacetoacetate)titanium,
mono-t-butoxy.tris(ethylacetoacetate)titanium,
tetrakis(ethylacetoacetate)titahium,
mono(acetylacetonate)tris(ethylacetoacetate)titanium,
bis(acetylacetonate)bis(ethylacetoacetate)titanium,
tris(acetylacetonate)mono(ethylacetoacetate)titanium;
zirconium chelate compounds such as
triethoxy.mono(acetylacetonate)zirconium,
tri-n-propoxy.mono(acetylacetonate)zirconium,
tri-i-propoxy.mono(acetylacetonate)zirconium,
tri-n-butoxy.mono(acetylacetonate)zirconium,
tri-sec-butoxy.mono(acetylacetonate)zirconium,
tri-t-butoxy.mono(acetylacetonate)zirconium,
diethoxy.bis(acetylacetonate)zirconium,
di-n-propoxy.bis(acetylacetonate)zirconium,
di-i-propoxy.bis(acetylacetonate)zirconium,
di-n-butoxy.bis(acetylacetonate)zirconium,
di-sec-butoxy.bis(acetylacetonate)zirconium,
di-t-butoxy.bis(acetylacetonate)zirconium,
monoethoxy.tris(acetylacetonate)zirconium,
mono-n-propoxy.tris(acetylacetonate)zirconium,
mono-i-propoxy.tris(acetylacetonate)zirconium,
mono-n-butoxy.tris(acetylacetonate)zirconium,
mono-sec-butoxy.tris(acetylacetonate)zirconium,
mono-t-butoxy.tris(acetylacetonate)zirconium,
tetrakis(acetylacetonate)zirconium,
triethoxy.mono(ethylacetoacetate)zirconium,
tri-n-propoxy.mono(ethylacetoacetate)zirconium,
tri-i-propoxy.mono(ethylacetoacetate)zirconium,
tri-n-butoxy.mono(ethylacetoacetate)zirconium,
tri-sec-butoxy.mono(ethylacetoacetate)zirconium,
tri-t-butoxy.mono(ethylacetoacetate)zirconium,
diethoxy.bis(ethylacetoacetate)zirconium,
di-n-propoxy.bis(ethylacetoacetate)zirconium,
di-i-propoxy.bis(ethylacetoacetate)zirconium,
di-n-butoxy.bis(ethylacetoacetate)zirconium,
di-sec-butoxy.bis(ethylacetoacetate)zirconium,
di-t-butoxy.bis(ethylacetoacetate)zirconium,
monoethoxy.tris(ethylacetoacetate)zirconium, mono-n-propoxy.tris(ethylacetoacetate)zirconium,
mono-i-propoxy.tris(ethylacetoacetate)zirconium,
mono-n-butoxy.tris(ethylacetoacetate)zirconium,
mono-sec-butoxy.tris(ethylacetoacetate)zirconium,
mono-sec-butoxy.tris(ethylacetoacetate)zirconium,
mono-t-butoxy.tris(ethylacetoacetate)zirconium,
tetrakis(ethylacetoacetate) zirconium,
mono(acetylacetonate)tris(ethylacetoacetate)zirconium,
bis(acetylacetonate)bis(ethylacetoacetate)zirconium, and
tris(acetylacetonate)mono(ethylacetoacetate)zirconium;
aluminum chelate compounds such as tris(acetylacetonate) aluminum and tris(ethylacetoacetate) aluminum.

As examples of the organic acids, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid can be given.

As examples of the inorganic acids, hydrochloric acid, nitric acid, sulfuric acid, hydrofluoric acid, and phosphoric acid can be given.

As examples of the organic bases, pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene, and tetramethylammonium hydroxide can be given.

As examples of the inorganic bases, ammonia, sodium hydroxide, potassium hydroxide, barium hydroxide, and calcium hydroxide can be given.

Of these catalysts, metal chelating compounds, organic acids, and inorganic acids are preferable, with particularly preferable catalysts being organic acids. Acetic acid, oxalic acid, maleic acid, and malonic acid are particularly preferable among organic acids. The use of an organic acid as a catalyst prevents occurrence of polymer deposition and gelling during hydrolysis and condensation. These catalysts may be used either individually or in combination of two or more.

The amount of the catalysts to be used is 0.00001–0.05 mol, preferably 0.00001–0.01 mol per one mol of the total $R^1O$— groups in the compounds (1)–(3).

The polystyrene-reduced weight average molecular weight of the component (A), when the compounds (1)–(3) are hydrolysis condensates, is usually about 500–300,000, preferably about 700–200,000, and more preferably about 1,000–100,000.

The component (A) is preferably a hydrolysis condensate containing the compound (2), and particularly preferably the compound (2) and compound (3). When the hydrolysis condensate contains both the compound (2) and compound (3), the amount, in terms by weight of complete hydrolysis condensate, of the compound (3) in the component (A) is preferably in the range 5–40 wt % of the total amount of the compounds (1), (2), and (3), and the amount of the compound (2) is preferable greater than the amount of the compound (3). If the amount of the compound (3), as the complete hydrolysis condensate, is less than 5 wt % of the total amount of the compounds (1)–(3), the resulting coating has impaired mechanical strength; if more than 40 wt %, water absorption increases and electrical characteristics are impaired. If the amount by weight of the compound (3) is greater than the amount of the compound (2), the resulting coating exhibits insufficient strength.

In the present invention, the complete hydrolysis condensate means any compound of (1)–(3) in which all $SiOR^1$ groups are hydrolyzed into SiOH groups and are completely condensed into a siloxane structure.

Component (B)

Polyoxyethylene-polyoxypropylene-polyoxyethylene block copolymer shown by the following formula is used as polyether of the component (B):

$(PEO)_p$—$(PPO)_q$—$(PEO)_r$ wherein PEO represents a polyethylene oxide unit (—$CH_2CH_2O$—), PPO represents a polypropylene oxide unit (—$CH_2CH(CH_3)O$—), p is a number of 2–200, q is a number of 20–80, and r is a number of 2–200.

Use of this block copolymer exhibiting balanced affinity with silica due to inclusion of polyoxyethylene units with high affinity with silica and polyoxypropylene units with low affinity with silica ensures formation of a coated film with a small vacant space size of 10 nm as determined by the BJH method and with a low density. The film has thus a low relative dielectric constant and the composition is useful as an interlayer dielectric material for micro wiring.

The terminal of the above block copolymer is usually a hydroxyl group, carboxyl group, alkoxy group, trialkoxysilyl group, or trialkoxysilylalkyl group, with the alkoxy group having 5 or less carbon atoms.

The polystyrene-reduced weight average molecular weight of the polyether (B) is usually in the range of 1,000 to 20,000, and preferably in the range of 2,000–15,000.

The amount of the polyether (B) used is usually from 1 to 80 parts by weight, and preferably from 5 to 65 parts by weight, for 100 parts by weight of the component (A) as the complete hydrolysis condensate. If the amount of the component (B) is less than 1 part by weight, the effect of the relative dielectric constant decrease is small; if more than 80 parts by weight, mechanical strength of the products will be inferior.

Solvent (C)

The film-forming composition of the present invention is a solution or dispersion of the component (A) and component (B) in an organic solvent (C).

As an organic solvent, alcohol solvents, ketone solvents, amide solvents, and ester solvents, and the like are given.

The following solvents can be given as examples of alcohol solvents: monohydric alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-polyethylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, and the like.

These alcohol solvents may be used either individually or in combination of two or more.

Of these alcohols, n-propanol, i-propanol, n-butanol, i-butanol, sec-butanol, t-butanol, n-pentanol, i-pentanol, 2-methylbutanol, sec-pentanol, t-pentanol, 3-methoxy butanol, n-hexanol, 2-methyl pentanol, sec-hexanol, 2-ethyl butanol, propylene glycol monomethyl ether, propylene glycol monoethyl ether, propylene glycol monopropyl ether, propylene glycol monobutyl ether, and the like are preferable.

Given as ketone solvents are acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclohexanone, methyl cyclohexanone, 2,4-pentane dione, acetonyl acetone, acetophenone, and fenchone, as well as β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, 1,1,1,5,5,5-hexafluoro-2,4-heptanedione, and the like.

These ketone solvents may be used either individually or in combination of two or more.

As amide solvents, formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholline, N-acetylpiperidine, N-acetylpyrrolidine, and the like can be given.

These amide solvents may be used either individually or in combination of two or more.

As ester solvents, diethyl carbonate, ethylene carbonate, propylene carbonate, diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given.

These ester solvents may be used either individually or in combination of two or more.

The above solvents (C) may be used either individually or in combination of two or more.

A composition exhibiting excellent applicability and superior storage stability can be obtained by using an alcohol solvent or a ketone solvent, or both as the organic solvent (C).

The same solvent (C) as used in the film-forming composition of the present invention may be used when the compounds (1)–(3) of the component (A) are hydrolyzed or condensed according to the method described later.

Specifically, water either as is or diluted with the above solvent is intermittently or continuously added to the solution in which the compounds (1)–(3) of the component (A) are dissolved. In this instance, the catalyst may be previously added to the solvent or may be dissolved or dispersed in water which is added later. The reaction temperature is usually from 0 to 100° C., and preferably from 15 to 90° C.

Other Additives

The film-forming composition of the present invention may further comprise other components such as colloidal silica, colloidal alumina, surfactants, and the like.

Colloidal silica is a dispersion of high purity silicic anhydride in a hydrophilic organic solvent, for example, with a solid content of about 10–40 wt %, wherein silica particles with an average diameter of 5–30 μm, and preferably 10–20 μm, are dispersed. Such colloidal silica is commercially available, for example, as methanol silica sol or iso-propanol silica sol (manufactured by Nissan Chemical Industries, Ltd.) or Oscal™ (manufactured by Catalysts & Chemicals Ind. Co., Ltd.).

The above colloidal alumina is commercially available, for example, as Alumina Sol 520™, Alumina Sol 100™, or Alumina Sol 200™ (manufactured by Nissan Chemical Industries, Ltd.), and Alumina Clear Sol™, Alumina Sol 10™, or Alumina Sol 132™ (manufactured by Kawaken Fine Chemicals Co., Ltd.).

As examples of surfactants, nonionic surfactants, anionic surfactants, cationic surfactants, and amphoteric surfactants can be given. These may be a silicon-containing surfactant, polyalkylene oxide surfactant, fluorine-containing surfactants, or the like.

Method of Preparing Film-forming Composition

The method of preparing the film-forming composition of the present invention includes, but is not limited to a method comprising mixing the compounds (1), (2), and (3) in the solvent (C), intermittently or continuously adding water to the mixture to effect hydrolysis and condensation, thereby producing the component (A), and adding the polyether (B) to the component (A) thus produced.

The following methods (1)–(4) can be given as specific examples of the method of preparing the composition of the present invention.

(1) A method of providing a mixture of the compounds (1), (2), and (3) for forming the component (A) and the solvent (C), adding a prescribed amount of water to the mixture to effect hydrolysis and condensation, and adding the component (B) to the hydrolysis-condensation reaction product.

(2) A method of providing a mixture of the compounds (1), (2), and (3) for forming the component (A) and the component (C), intermittently or continuously adding a prescribed amount of water to the mixture to effect hydrolysis and condensation, and adding the component (B) to the hydrolysis-condensation reaction product.

(3) A method of providing a mixture of the compounds (1), (2), and (3) for forming the component (A), the component (B), and the component (C), and adding a prescribed amount of water to the mixture to effect hydrolysis and condensation.

(4) A method of providing a mixture of the compounds (1), (2), and (3) for forming the component (A), the component (B), and the component (C), and intermittently or continuously adding a prescribed amount of water to the mixture to effect hydrolysis and condensation.

The total solid content in the composition of the present invention thus obtained may be appropriately adjusted according to the target application, preferably, in the range of 2–30 wt %. The total solid content in the range of 2–30 wt % not only ensures production of a coated film thickness in an appropriate range, but also ensures excellent storage stability of the composition.

If required, the total solid content may be adjusted by concentrating the composition or diluting the composition with the solvent (C).

The composition of the present invention exhibits excellent storage stability. For example, a coating made from the composition stored in a glass container for one month at 40° C. exhibits a thickness change of no more than 10% as compared with the thickness of the coating made from the composition before storage.

Method of Forming Film From the Composition

When forming a film using the composition of the present invention, the composition is first coated onto a substrate to produce a coated film.

A semi-conductor, glass, ceramics, metal, and the like can be given as the substrate to be coated with the composition of the present invention.

Spin coat, dipping, and roller blade application can be given as the method of coating.

The composition of the present invention is particularly suitable for use in the manufacture of insulating films by coating onto a silicon wafer, $SiO_2$ wafer, SiN wafer, and the like.

A coated film with a dry thickness of about 0.05–1.5 µm is obtained by a single application, and about 0.1–3 µm is obtained by one further application of the composition of the present invention.

The film thickness formed is usually 0.2–20 µm.

A hot plate, oven, furnace, and the like can be used for heating the coated film in air, in nitrogen or argon, under vacuum, or under reduced pressure in which oxygen concentration is controlled.

As the heating method, (1) a method of heating the coated film at a temperature less than the decomposition temperature of the component (B) to partly cure the component (A), and then heating at a temperature above the decomposition temperature of the component (B) but below the final curing temperature to produce a cured film with a low density, (2) a method of heating the coated film at a temperature above the decomposition temperature of the component (B) to produce a cured film with a low density, and the like can be given.

An appropriate measure such as step-wise heating, selection of heating atmosphere such as use of nitrogen, air, oxygen, reduced pressure, etc., may be optionally employed to control the rate of curing of the component (A) and the rate of decomposition of the component (B).

Because the decomposition temperature of the component (B) is between 200 and 400° C., and preferably between 200 and 350° C., the film-forming process includes a step of ultimately heating the coated film above this temperature. This step is preferably carried out under reduced pressure or in an inert gas.

The low density film of the present invention thus prepared has a film density of usually 0.35–1.5 $g/cm^3$, preferably 0.4–1.3 $g/cm^3$, and still more preferably 0.5–1.1 $g/cm^3$. If the film density is less than 0.35 $g/cm^3$, the film strength is insufficient; if more than 1.5 $g/cm^3$, a low relative dielectric constant cannot be obtained.

The film density can be easily adjusted by controlling the content of the component (B) in the film-forming composition of the present invention.

The low density film of the present invention does not have a vacant pore with a size 10 nm or more, measured by the BJH pore distribution measurement, and is thus suitable for use as an interlayer dielectric material for micro wiring.

The micro-pores in the film can be obtained by using the component (B) in the present invention.

Another feature of the low density film of the present invention is the low hygroscopicity. For instance, no water absorption by IR spectrum measurement is observed in the film which has been allowed to stand under the conditions of 127° C., 2.5 atm., and 100% RH for one hour.

This low hygroscopicity can be accomplished in the present invention by controlling the content of the compound (3) in the film-forming composition within the range described above.

The low density film of the present invention has a low relative dielectric constant, which is usually 2.6–1.2, preferably 2.5–1.2, and still more preferably 2.4–1.2.

The relative dielectric constant of the film can be adjusted in the present invention by controlling the content of the component (B) in the film-forming composition.

Due to excellent insulation properties, homogeneous film thickness, low relative dielectric constant, anti-crack properties, and superior coating film hardness, the low density film of the present invention is useful for many applications such as an interlayer dielectric for semiconductor devices such as LSI, system LSI, DRAM, SDRAM, RDRAM, and D-RDRAM, an overcoat such as a surface coating for semiconductor devices, an interlayer dielectric of multiple layer interconnecting substrates, and an overcoat and insulation film for a liquid crystal display element, and the like.

EXAMPLES

The present invention will now be described in more detail by way of examples. These examples illustrate an embodiment of the present invention and should not be construed as limiting the present invention.

In the following examples and comparative examples, "parts" and "%" respectively refer to "parts by weight" and "wt %" unless otherwise indicated.

Example 1

(1) Preparation of Component (A)

A mixed solution was prepared from 101.3 g of tetramethoxysilane (40 g as the complete hydrolysis condensate: compound (3)), 203.0 g of methyltrimethoxysilane (100.0 g as the complete hydrolysis condensate: compound (2)), 97.3 g of dimethyldimethoxysilane (60.0 g as the complete hydrolysis condensate: compound (1)), 559.3 g of propylene glycol monopropyl ether, and 239.7 g of methyl n-pentyl ketone. To this solution, 1.0 g of maleic acid as a catalyst (the molar ratio of the catalyst/the total mols of $R^1O-$ in the compounds (1)–(3)=0.001) and 157.7 g of water (the molar ratio of water/the total mols of $R^1O-$ in the compounds (1)–(3)=1.0) were added dropwise in one hour at room temperature. After the addition, the mixture was allowed to react at 60° C. for two hours and concentrated under reduced pressure to a weight of 1,000 g, thereby obtaining polysiloxane sol with a solid content of 20%.

(2) Preparation of Composition 3.5 g of polyoxyethylene-polyoxypropylene-polyoxyethylene block copolymer (New Pole 61™ manufactured by Sanyo Chemical Industries, Ltd. with a chemical structure corresponding to HO—$PEO_2$—$PPO_{30}$—$PEO_2$—OH) was added to 100 g (20 g as solid content) of the polysiloxane sol obtained in above to obtain a film-forming composition.

(3) Preparation of Film

The film-forming composition was coated onto an 8-inch silicon wafer by spin coating, and heated for five minutes at 80° C. in air, for a further five minutes at 200° C. in a nitrogen gas, for 30 minutes at 340° C., 30 minutes at 360° C., and 30 minutes at 380° C. under vacuum, and finally for one hour at 425° C. under vacuum, thereby obtaining a transparent colorless film.

The composition and the resulting film were evaluated as follows. The results are shown in Table 1. (4) Evaluation of Film-forming Composition 1. Storage Stability 80 ml of the film-forming composition of the present invention was placed in a 100 ml screw mouth glass bottle. The bottle was sealed and allowed to stand for one month in an autoclave at 40° C. The samples before and after storage were applied to a substrate by spin coating at 2,500 rpm for 31 seconds and treated with heat according to the method described in Example 1. The thickness of the coating was measured using an optical film thickness meter, Spectra Laser 200™ (manufactured by Rudolph Technologies Co.) to determine the change in the thickness according to the following formula: {(Thickness after storage–Thickness before storage)/(Thickness before storage)}×100. The results were grouped as follows.

Excellent: Thickness change<10%

Fair: Thickness change≧10%

2. Relative Dielectric Constant

A sample for evaluation of relative dielectric constant was prepared by forming an electrode pattern onto the film obtained above by vapor deposition. The relative dielectric constant of the sample was measured by the CV method at a frequency of 100 kHz using an electrode HP 16451B™ and a precision LCR meter HP 4284A™, both manufactured by Yokogawa-Hewlett Packard Co., Ltd. The results are shown in Table 1.

3. Moisture Uptake

The silicon wafer on which the film was prepared in the same manner as in Example 1(3) was dipped into purified water for one hour to determine the weight change after dipping.

4. Film Density

The density was determined from the volume, which was calculated from the thickness and area, and the weight of the film.

5. Pore Size Distribution

The pore size distribution of the cured product was determined by the BJH method using OMNISORP 100/360 SERIES™ manufactured by COULTER Co. The results were classified as follows.

Excellent: No pores greater than 10 nm were observed.

Fair: Pores greater than 10 nm were observed.

6. Elasticity

Elasticity of the film was determined by the continuous rigidity measuring method using Nanoindenter XP™ (manufactured by Nano Instrument Co.).

7. Hygroscopicity

The film was allowed to stand at a temperature of 127° C. and 50% RH under a pressure of 2.5 atmospheres for one hour, followed by IR spectrum measurement. The IR spectra of the film before and after standing were compared with respect to the presence or absence of absorption due to $H_2O$ in the neighborhood of 3,500 $cm^{-1}$.

Excellent: No absorption was observed.

Fair: An absorption peak was observed.

Example 2

(1) Preparation of Component (A)

A mixed solution was prepared from 152.0 g of tetramethoxysilane (60.0 g as the complete hydrolysis condensate: compound (3)), 284.1 g of methyltrimethoxysilane (140.0 g as the complete hydrolysis condensate: compound (2)), and 798.8 g of propylene glycol monomethyl ether. To this solution, 1.0 g of oxalic acid as a catalyst (molar ratio of catalyst/total mols of $R^1O-$ in the compounds (2)–(3)= 0.001) and 157.7 g of water (molar ratio of water/total mols of $R^1O-$ in the compounds (2)–(3)=1.0) were added dropwise in one hour at room temperature. After the addition, the mixture was allowed to react at 60° C. for two hours and concentrated under reduced pressure to a weight of 1,000 g, thereby obtaining polysiloxane sol with a solid content of 20%.

(2) Preparation of Composition 8.6 g of polyoxyethylene-polyoxypropylene-polyoxyethylene block copolymer (New Pole 62™ manufactured by Sanyo Chemical Industries, Ltd. with a chemical structure corresponding to HO—$PEO_5$—$PPO_{30}$—$PEO_5$—OH) was added to 100 g (20 g as solid content) of the polysiloxane sol obtained above to obtain a film-forming composition.

(3) Preparation of Film

The film-forming composition was coated onto an 8-inch silicon wafer by spin coating, and heated for five minutes at 80° C. in air, for a further five minutes at 200° C. in nitrogen gas, for 30 minutes at 340° C., 30 minutes at 360°C., and 30 minutes at 380° C. under vacuum, and finally for one hour at 425° C. under vacuum, thereby obtaining a transparent colorless film.

The composition and film were evaluated in the same manner as in Example 1. The results are shown in Table 1.

Example 3

(1) Preparation of Component (A)

A mixed solution was prepared from 101.3 g of tetramethoxysilane (40.0 g as the complete hydrolysis condensate: compound (3)), 324.7 g of methyltrimethoxysilane (160.0 g as the complete hydrolysis condensate: compound (2)), 783.3 g of propylene glycol monopropyl ether, and di-i-propoxy.bis(ethylacetoacetate) titanium as a catalyst, in the amount satisfying the molar ratio of the catalyst per the total mols of $R^1O-$ in the compounds (2)–(3) of 0.004. Then, 176.8 g of water (molar ratio of water/total mols of $R^1O-$ in the compounds (2)–(3)=1.0) was added dropwise to this solution in one hour at 60° C. After the addition, the mixture was allowed to react at 60° C. for two hours, 100.0 g of acetylacetone was added, and the resulting mixture was concentrated under reduced pressure to a weight of 1,000 g, thereby obtaining polysiloxane sol with a solid content of 20%.

(2) Preparation of Composition 3.5 g of polyoxyethylene-polyoxypropylene-polyoxyethylene block copolymer (New Pole 71™ manufactured by Sanyo Chemical Industries, Ltd. with a chemical structure corresponding to HO—PEO$_3$—PPO$_{35}$—PEO$_3$—OH) was added to 100 g (20 g as solid content) of the polysiloxane sol obtained above to obtain a film-forming composition.

(3) Preparation of Film

The film-forming composition was coated onto an 8-inch silicon wafer by spin coating, and heated for five minutes at 80° C. in air, for a further five minutes at 200° C. in nitrogen gas, for 30 minutes at 340° C., 30 minutes at 360° C., and 30 minutes at 380° C. under vacuum, and finally for one hour at 425° C. under vacuum, thereby obtaining a transparent colorless film.

The composition and film were evaluated in the same manner as in Example 1. The results are shown in Table 1.

Reference Example 1

(1) Preparation of Component (A)

A mixed solution was prepared from 560 g of tetraethoxysilane (146.0 g as the complete hydrolysis condensate: compound (3)), 559.3 g of propylene glycol monopropyl ethyl ether, and 239.7 g of methyl-n-pentyl ketone. To this solution, 1.0 g of maleic acid as a catalyst (molar ratio of catalyst/total mols of R$^1$O— in the compound (3)=0.001)

Reference Example 2

A composition was prepared in the same manner as in Example 1, except that no polyoxyethylene-polyoxy propylene-polyoxyethylene block copolymer was used. The composition was applied to a substrate and heated to prepare a film. The composition and film were evaluated in the same manner as in Example 1. The results are shown in Table 1.

Reference Example 3

A composition was prepared in the same manner as in Example 1, except that 799.0 g of tetrahydrofuran was used instead of 559.3 g of propylene glycol monopropyl ether and 239.7 g of methyl n-pentyl ketone. The composition was applied to a substrate and heated to prepare a film. The composition and film were evaluated in the same manner as in Example 1. The results are shown in Table 1.

Reference Example 4

A composition was prepared in the same manner as in Example 1, except that polymethyl methacrylate resin (molecular weight: 20,000) was used instead of 3.5 g of polyoxyethylene-polyoxy propylene-polyoxyethylene block copolymer. The composition was applied to a substrate and heated to prepare a film.

The composition and film were evaluated in the same manner as in Example 1. The results are shown in Table 1.

TABLE 1

|  | Example | | | Reference Example | | | |
|---|---|---|---|---|---|---|---|
|  | 1 | 2 | 3 | 1 | 2 | 3 | 4 |
| Storage stability | Excellent | Excellent | Excellent | Excellent | Excellent | Fair | Excellent |
| Relative dielectric constant | 2.3 | 2.1 | 2.3 | 2.4 | 2.8 | 2.5 | 2.5 |
| Moisture uptake | +0.3% | +0.5% | +0.1% | +2% | +0.5% | +0.4% | +0.2% |
| Film density (g/cm$^3$) | 1.1 | 0.9 | 1.1 | 1.2 | 1.4 | 1.2 | 1.3 |
| Pore size distribution | Excellent | Excellent | Excellent | Excellent | Excellent | Excellent | Fair |
| Elasticity (Gpa) | 3.8 | 3.0 | 3.3 | 4.5 | 5.5 | 3.5 | 3.2 |
| Hygroscopicity | Excellent | Excellent | Excellent | Excellent | Excellent | Excellent | Fair | and 157.7 g of water (molar ratio of water/total mols of R$^1$O— in the compounds (3)=1.0) were added dropwise in one hour at room temperature. After the addition, the mixture was allowed to react at 60° C. for two hours and concentrated under reduced pressure to a weight of 1,000 g, thereby obtaining polysiloxane sol with a solid content of 20%.

(2) Preparation of Composition 3.5 g of polyoxyethylene-polyoxypropylene-polyoxyethylene block copolymer (New Pole 61™ manufactured by Sanyo Chemical Industries, Ltd. with a chemical structure of HO—PEO$_2$—PPO$_{30}$—PEO$_2$—OH) was added to 100 g (20 g as solid content) of the polysiloxane sol obtained above to obtain a film-forming composition.

(3) Preparation of Film

The film-forming composition was coated onto an 8-inch silicon wafer by spin coating, and heated for five minutes at 80° C. in air, for a further five minutes at 200° C. in a nitrogen gas, for 30 minutes at 340° C., 30 minutes at 360° C., and 30 minutes at 380° C. under vacuum, and finally for one hour at 425° C. under vacuum, thereby obtaining a transparent colorless film.

The composition and film were evaluated in the same manner as in Example 1. The results are shown in Table 1.

A film-forming composition excelling in storage stability and capable of producing a low-density film having a small relative dielectric constant, exhibiting low water absorption properties, and having small vacant space size can be obtained by the present invention.

Obviously, numerous modifications and variations of the present invention are possible in light of the above teachings. It is therefore to be understood that, within the scope of the appended claims, the invention may be practiced otherwise than as specifically described herein.

What is claimed is:

1. A film-forming composition comprising:

(A) at least one silane compound selected from the group consisting of a compound shown by the following formula (1), a compound shown by the following formula (2), and a compound shown by the following formula (3) and a hydrolysis condensate consisting essentially of these compounds:

$$R^2R^3Si(OR^1)_2 \quad (1)$$

$$R^2Si(OR^1)_3 \quad (2)$$

$$Si(OR^1)_4 \quad (3)$$

wherein R$^1$, R$^2$, and R$^3$ individually represent a monovalent organic group, (B) a polyether shown by the formula $(PEO)_p$—$(PPO)_q$—$(PEO)_r$, wherein PEO represents a polyethylene oxide unit, PPO represents a polypropylene oxide unit, p is a number of 2–200, q is a number of 20–80, and r is a number of 2–200, and (C) an organic solvent.

2. The film-forming composition according to claim 1, wherein the component (A) comprises a hydrolysis condensate of one or more silane compounds selected from the group consisting of a compound of the formula (1), a compound of the formula (2), and a compound of the formula (3).

3. The film-forming composition according to claim 2, wherein the hydrolysis condensate is prepared by a hydrolysis condensation reaction of the silane compounds in the presence of water and a catalyst.

4. The film-forming composition according to claim 3, wherein the catalyst is selected from the group consisting of a metal chelating compound, an organic acid, an inorganic acid, an organic base, and an inorganic base.

5. The film-forming composition according to claim 3, wherein the hydrolysis condensation reaction is carried out further in the presence of an organic solvent (C).

6. The film-forming composition according to claim 2, wherein the hydrolysis condensate is a hydrolysis condensate of silane compounds which comprise a compound of the formula (2).

7. The film-forming composition according to claim 2, wherein the hydrolysis condensate is a hydrolysis condensate of silane compounds which comprise a compound of the formula (2) and a compound of the formula (3).

8. The film-forming composition according to claim 7, wherein the component (A) comprises the compound of the formula (3) in the amount, in terms by weight of complete hydrolysis condensate, of 5 to 40 wt % of the total amount of the compound of the formula (1), the compound of the formula (2), and the compound of the formula (3).

9. The film-forming composition according to claim 7, wherein the amount by weight of the compound of the formula (2) is greater than the amount of the compound of the formula (3).

10. The film-forming composition according to claim 2, wherein the polystyrene-reduced weight average molecular weight of the component (A) is 500–300,000.

11. The film-forming composition according to claim 1, wherein the polystyrene-reduced weight average molecular weight of the component (B) is 1,000–20,000.

12. The film-forming composition according to claim 1, comprising 1–80 parts by weight of the component (B) for 100 parts by weight of the component (A) as a complete hydrolysis-condensate.

13. The film-forming composition according to claim 5, wherein the solvent (C) is an alcohol solvent or a ketone solvent, or both.

14. A method of forming a film comprising applying the film-forming composition of claim 1 onto a substrate to produce a coated film and heating the coated film.

15. A method of forming a film comprising applying the film-forming composition of claim 1 onto a substrate to produce a coated film, heating the coated film at a temperature less than the decomposition temperature of the component (B) to partly cure the component (A), and heating the coated film at a temperature above the decomposition temperature of the component (B).

16. A method of forming a film comprising applying the film-forming composition of claim 1 onto a substrate to produce a coated film and heating the coated film at a temperature above the decomposition temperature of the component (B).

17. A low-density cured film prepared by the method described in claim 14.

* * * * *